US012604491B2

(12) United States Patent
Murasaki

(10) Patent No.: US 12,604,491 B2
(45) Date of Patent: Apr. 14, 2026

(54) SEMICONDUCTOR DEVICE INCLUDING AUXILIARY ELECTRODE THAT IS ELECTRICALLY CONNECTED TO A CONTROL ELECTRODE VIA A SECOND ELECTRODE LAYER

(71) Applicant: ROHM CO., LTD., Kyoto (JP)

(72) Inventor: Kohei Murasaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 430 days.

(21) Appl. No.: 18/025,642

(22) PCT Filed: Nov. 9, 2021

(86) PCT No.: PCT/JP2021/041141
§ 371 (c)(1),
(2) Date: Mar. 10, 2023

(87) PCT Pub. No.: WO2022/153652
PCT Pub. Date: Jul. 21, 2022

(65) Prior Publication Data
US 2023/0335626 A1      Oct. 19, 2023

(30) Foreign Application Priority Data

Jan. 12, 2021    (JP) ................................. 2021-003065

(51) Int. Cl.
*H10D 12/00*        (2025.01)
*H01L 23/00*        (2006.01)
(Continued)

(52) U.S. Cl.
CPC ........... *H10D 12/481* (2025.01); *H01L 24/05* (2013.01); *H10D 12/038* (2025.01);
(Continued)

(58) Field of Classification Search
CPC .. H10D 12/481; H10D 12/038; H10D 62/106; H10D 64/281; H10D 64/112;
(Continued)

(56) References Cited

U.S. PATENT DOCUMENTS

2003/0042537 A1* 3/2003 Nakamura ........... H10D 12/441
257/E29.198
2013/0248994 A1* 9/2013 Ninomiya ........... H10D 62/393
257/334

(Continued)

FOREIGN PATENT DOCUMENTS

JP      2011-135115 A      7/2011
JP      2011192822 A  *  9/2011

(Continued)

OTHER PUBLICATIONS

International Search Report and Written Opinion mailed on Jan. 25, 2022, received for PCT Application PCT/JP2021/041141, filed on Nov. 9, 2021, 17 pages including English Translation.

(Continued)

*Primary Examiner* — Mohammad M Hoque
(74) *Attorney, Agent, or Firm* — XSENSUS LLP

(57) ABSTRACT

A semiconductor device includes a semiconductor layer, a first conductive type first region formed in a surface layer portion of a first principal surface of the semiconductor layer, a cell structure having a second conductive type second region formed in a surface layer portion of the first region, a first conductive type third region formed in the surface layer portion of the first region such that third region is in contact with the second region, and a control electrode opposing the second region via a first insulating film adjacent to the second region, the control electrode forming a current path in the second region, a first electrode layer formed on the first principal surface such that the first electrode layer covers the cell structure, and electrically
(Continued)

connected to the third region, a second electrode layer formed on the first principal surface separately from the first electrode layer.

15 Claims, 13 Drawing Sheets

(51) Int. Cl.
*H10D 12/01* (2025.01)
*H10D 62/10* (2025.01)
*H10D 64/27* (2025.01)
*H10D 64/00* (2025.01)

(52) U.S. Cl.
CPC ......... *H10D 62/106* (2025.01); *H10D 64/281* (2025.01); *H01L 24/06* (2013.01); *H01L 24/48* (2013.01); *H01L 24/49* (2013.01); *H01L 2224/05567* (2013.01); *H01L 2224/05573* (2013.01); *H01L 2224/05582* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06181* (2013.01); *H01L 2224/48245* (2013.01); *H01L 2224/49111* (2013.01); *H01L 2924/13055* (2013.01); *H10D 64/112* (2025.01)

(58) Field of Classification Search
CPC .. H10D 30/665; H10D 30/668; H10D 64/117; H10D 62/112; H01L 24/05; H01L 24/06; H01L 24/48; H01L 24/49; H01L 2224/05567; H01L 2224/05573; H01L 2224/05582; H01L 2224/05624; H01L 2224/05639; H01L 2224/05644; H01L 2224/05647; H01L 2224/05655; H01L 2224/06181; H01L 2224/48245; H01L 2224/49111; H01L 2924/13055; H01L 24/08; H01L 2224/04042
USPC .......................................................... 257/139
See application file for complete search history.

(56) References Cited

U.S. PATENT DOCUMENTS

| | | | | |
|---|---|---|---|---|
| 2014/0264569 | A1* | 9/2014 | Yedinak ............... | H10D 64/117 |
| | | | | 257/330 |
| 2020/0058645 | A1* | 2/2020 | Harada ................ | H10D 12/461 |
| 2020/0066887 | A1* | 2/2020 | Imai .................... | H10D 12/481 |
| 2020/0161460 | A1* | 5/2020 | Harada ................ | H10D 64/519 |
| 2022/0238698 | A1* | 7/2022 | Moore ................. | H10D 62/106 |

FOREIGN PATENT DOCUMENTS

| | | | | |
|---|---|---|---|---|
| JP | 2013-201266 A | 10/2013 | | |
| JP | 2020-031167 A | 2/2020 | | |
| JP | 2020-150179 A | 9/2020 | | |
| JP | 2020194881 A | * 12/2020 | ............. | H10D 1/692 |
| WO | 02/058160 A1 | 7/2002 | | |

OTHER PUBLICATIONS

Office Action issued Jul. 19, 2023 in German Patent Application No. 11 2021 004 310.2, 15 pages.
Notice of Reasons for Refusal dated Sep. 4, 2025 in corresponding Japanese patent application No. 2022-575089 (12 pages; with English machine translation).

* cited by examiner

SEMICONDUCTOR DEVICE INCLUDING AUXILIARY ELECTRODE THAT IS ELECTRICALLY CONNECTED TO A CONTROL ELECTRODE VIA A SECOND ELECTRODE LAYER

CROSS-REFERENCE TO RELATED APPLICATIONS

The present application is based on PCT filing PCT/JP2021/041141, filed Nov. 9, 2021, which claims priority to Japanese Patent Application No. 2021-003065, filed Jan. 12, 2021, the entire contents of each are incorporated herein by reference.

TECHNICAL FIELD

The present disclosure relates to a semiconductor device.

BACKGROUND ART

Patent Literature 1 discloses a semiconductor device including a semiconductor substrate which has an active region, and a source pad and a gate pad provided on a front surface of the active region via an interlayer insulating film. The source pad and the gate pad are embedded in a first contact hole of the interlayer insulating film in a portion of the active region excluding a gate pad region and a gate resistive region. In a portion of the active region opposing the depth direction of the source pad, unit cells (constituent unit of element) are disposed.

CITATION LIST

Patent Literature

Patent Literature 1: Japanese Patent Application Publication No. 2020-150179

SUMMARY OF INVENTION

Solution to Problem

A semiconductor device according to a preferred embodiment of the present disclosure includes a semiconductor layer having a first principal surface and a second principal surface on the opposite side of the first principal surface, a first conductive type first region formed in a surface layer portion of the first principal surface of the semiconductor layer, a cell structure having a second conductive type second region formed in a surface layer portion of the first region, a first conductive type third region formed in the surface layer portion of the first region so as to be in contact with the second region, and a control electrode opposing the second region via a first insulating film adjacent to the second region, the control electrode forming a current path in the second region, a first electrode layer formed on the first principal surface of the semiconductor layer so as to cover the cell structure, and electrically connected to the third region, a second electrode layer formed on the first principal surface of the semiconductor layer separately from the first electrode layer, and electrically connected to the control electrode, a first recess portion formed in the surface layer portion of the first principal surface of the semiconductor layer so as to oppose the second electrode layer, a second insulating film covering the first recess portion, and an auxiliary electrode embedded in the first recess portion via the second insulating film, and electrically connected to the second electrode layer.

BRIEF DESCRIPTION OF DRAWINGS

FIG. 11 is a circuit diagram showing an electrical structure of the semiconductor device.

DESCRIPTION OF EMBODIMENTS

Preferred Embodiments of Present Disclosure

Figure 1:
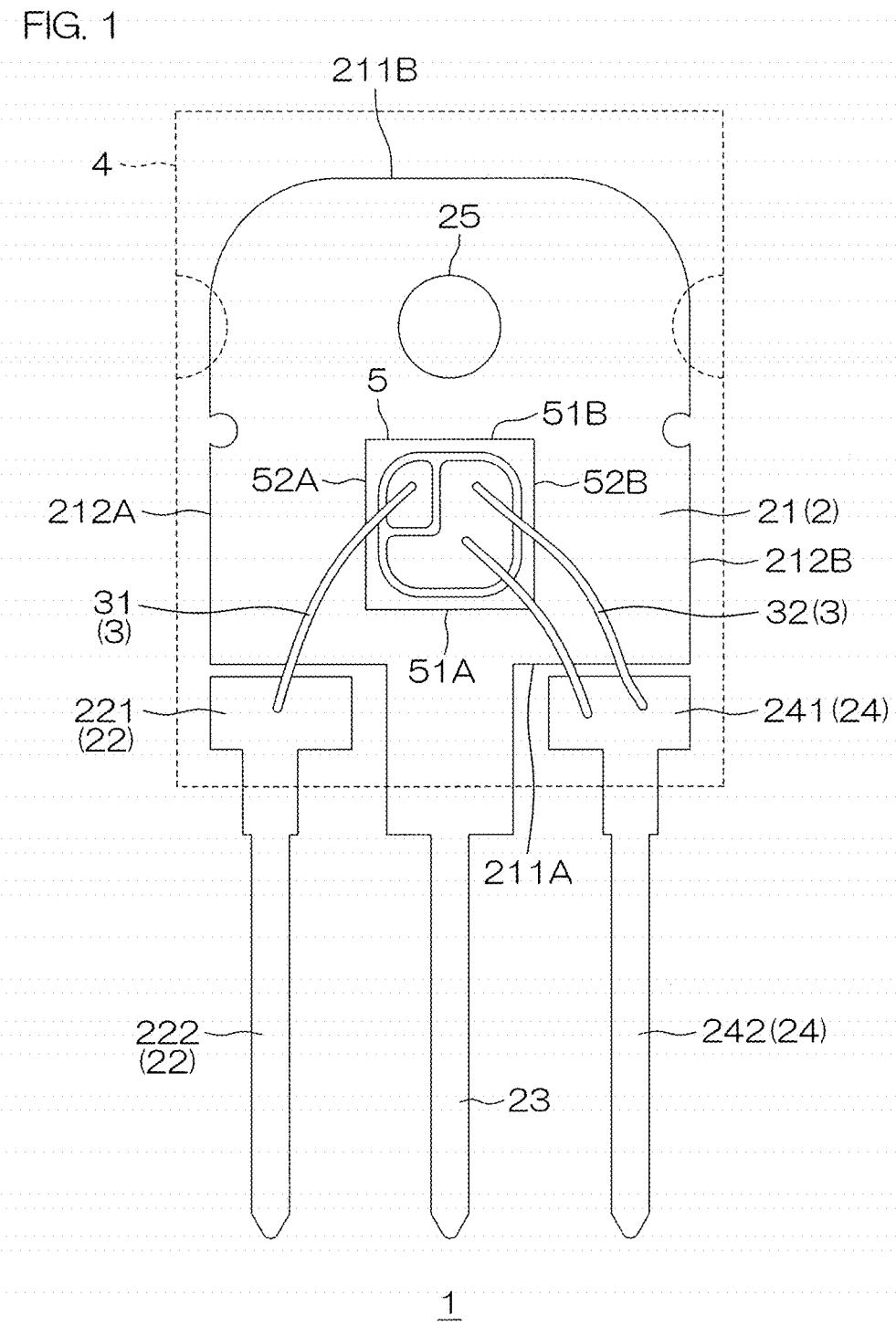
FIG. 1 is a schematic bird's-eye view of a semiconductor device according to a first preferred embodiment of the present disclosure.

First, preferred embodiments of the present disclosure will be listed and described.

A semiconductor device according to a preferred embodiment of the present disclosure includes a semiconductor layer having a first principal surface and a second principal surface on the opposite side of the first principal surface, a first conductive type first region formed in a surface layer portion of the first principal surface of the semiconductor layer, a cell structure having a second conductive type second region formed in a surface layer portion of the first region, a first conductive type third region formed in the surface layer portion of the first region so as to be in contact with the second region, and a control electrode opposing the second region via a first insulating film, the control electrode forming a current path in the second region, a first electrode layer formed on the first principal surface of the semiconductor layer so as to cover the cell structure, and electrically connected to the third region, a second electrode layer formed on the first principal surface of the semiconductor layer separately from the first electrode layer, and electrically connected to the control electrode, a first recess portion formed in the surface layer portion of the first principal surface of the semiconductor layer so as to oppose the second electrode layer, and an auxiliary electrode embedded in the first recess portion via a second insulating film, and electrically connected to the first electrode layer.

With this arrangement, the auxiliary electrode is electrically connected to the control electrode via the second electrode layer. Since the auxiliary electrode is embedded in the first recess portion, in comparison to the case where the auxiliary electrode is formed in a layer shape along the first principal surface of the semiconductor layer, it is possible to increase electrostatic capacitance between the auxiliary electrode and the semiconductor layer which oppose each other via the second insulating film. Thereby, it is possible to increase parasitic capacitance between the first electrode layer and the second electrode layer. As a result, it is possible to provide a semiconductor device having good electrostatic breakdown resistance characteristics.

Further, the auxiliary electrode is formed separately from the cell structure. Therefore, even when the auxiliary electrode is formed, it is possible to suppress the influence of a layout change, etc., on the cell structure. Thus, it is possible to maintain the characteristics of ON resistance, etc., of the semiconductor device.

The semiconductor device according to the preferred embodiment of the present disclosure may include a second conductive type fourth region formed in the surface layer portion of the first region so as to oppose the second electrode layer, and the first recess portion may be formed in the fourth region.

In the semiconductor device according to the preferred embodiment of the present disclosure, a part of the fourth region may be interposed between a bottom portion of the first recess portion and the first region in the thickness direction of the semiconductor layer.

Thereby, since the bottom portion of the first recess portion is covered by the fourth region, it is possible to suppress an electric field from concentrating on the bottom portion of the first recess portion.

In the semiconductor device according to the preferred embodiment of the present disclosure, the part of the fourth region may have a thickness of 1 μm or more.

In the semiconductor device according to the preferred embodiment of the present disclosure, a first depth of the fourth region from the first principal surface may be 7 μm or more and 10 μm or less, and a second depth of the first recess portion from the first principal surface may be 6 μm or less.

In the semiconductor device according to the preferred embodiment of the present disclosure, the cell structure may include a trench cell structure having a second recess portion formed in the surface layer portion of the first principal surface of the semiconductor layer, the control electrode embedded in the second recess portion via the first insulating film, the third region and the second region formed on a side surface of the second recess portion in order from the first principal surface to the second principal surface.

In the semiconductor device according to the preferred embodiment of the present disclosure, the first recess portion and the second recess portion may have substantially the same depth.

In the semiconductor device according to the preferred embodiment of the present disclosure, a depth of the first recess portion may be smaller than a depth of the second recess portion.

In the semiconductor device according to the preferred embodiment of the present disclosure, both the first recess portion and the second recess portion may be formed in a striped shape extending in a first direction.

The semiconductor device according to the preferred embodiment of the present disclosure may include a second conductive type collector region formed in a surface layer portion of the second principal surface of the semiconductor layer, and the cell structure may include an IGBT cell structure having a base region formed of the second region, an emitter region formed of the third region, and a gate electrode formed of the control electrode.

A semiconductor device according to a preferred embodiment of the present disclosure may include a semiconductor layer having a first principal surface and a second principal surface on the opposite side of the first principal surface, an active region formed in a surface layer portion of the first principal surface of the semiconductor layer, the active region in which a cell structure is formed, the cell structure having a control electrode formed on a first insulating film in contact with the semiconductor layer, in which a current path is formed by voltage control of the control electrode, a first electrode layer formed on the active region, and connected to the current path, a second electrode layer formed on the first principal surface of the semiconductor layer in a region outside the active region, and electrically connected to the control electrode, a first recess portion formed in the surface layer portion of the first principal surface of the semiconductor layer so as to oppose the second electrode layer, and an auxiliary electrode embedded in the first recess portion via a second insulating film, and electrically connected to the second electrode layer.

With this arrangement, the auxiliary electrode is electrically connected to the control electrode via the second electrode layer. Since the auxiliary electrode is embedded in the first recess portion, in comparison to the case where the auxiliary electrode is formed in a layer shape along the first principal surface of the semiconductor layer, it is possible to increase electrostatic capacitance between the auxiliary electrode and the semiconductor layer which oppose each other via the second insulating film. Thereby, it is possible to increase parasitic capacitance between the first electrode layer and the second electrode layer. As a result, it is possible to provide a semiconductor device having good electrostatic breakdown resistance characteristics.

Further, the auxiliary electrode is formed in a region outside the active region. Therefore, even when the auxiliary electrode is formed, it is possible to suppress the influence of a layout change, etc., on the cell structure. Thus, it is possible to maintain the characteristics of ON resistance, etc., of the semiconductor device.

In the semiconductor device according to the preferred embodiment of the present disclosure, the second insulating film may have a thickness of 100 nm or more and 120 nm or less.

In the semiconductor device according to the preferred embodiment of the present disclosure, the auxiliary electrode may include a first portion embedded in the first recess portion, and a second portion integrated with the first portion and formed on the first principal surface of the semiconductor layer, and the semiconductor device may include a third insulating film formed between the second portion of the auxiliary electrode and the second electrode layer, the third insulating film having a contact hole for connection between the auxiliary electrode and the second electrode layer, and a conductive member connected to the second electrode layer in a region where the contact hole is avoided in a plan view.

For example, a level difference is generated between a front surface of the third insulating film and a bottom surface of the contact hole (front surface of the second portion of the auxiliary electrode). Due to this level difference, the portion embedded in the contact hole of the second electrode layer may be recessed in comparison to the other regions of the second electrode layer. Thus, by connecting the conductive member to the second electrode layer in the region where the contact hole is avoided, it is possible to prevent connection failure of the conductive member.

In the semiconductor device according to the preferred embodiment of the present disclosure, the second electrode layer may include a pad electrode layer to which the conductive member is connected.

DETAILED DESCRIPTION OF PREFERRED EMBODIMENTS OF PRESENT DISCLOSURE

Next, the preferred embodiments of the present disclosure will be described in detail with reference to the attached drawings. In the following detailed description, there are a plurality of constituent elements with names having ordinal numbers. However, the ordinal numbers do not necessarily match the ordinal numbers of constituent elements described in Claims.

First Preferred Embodiment

FIG. 1 is a schematic bird's-eye view of a semiconductor device 1 according to a first preferred embodiment of the present disclosure. For clarification, in FIG. 1, a package 4 is shown by an imaginary line (broken line), and the other arrangements are shown by solid lines.

The semiconductor device 1 includes a lead frame 2, a conductive member 3, the package 4, and a semiconductor element 5.

The lead frame 2 is a metal member formed in a plate shape. The lead frame 2 is formed from a thin metal plate of Cu, etc., formed in a rectangular shape in a plan view by means of punching, cutting, bending, etc. Therefore, a main component of a material of the lead frame 2 is Cu. The material of the lead frame 2 is not limited to this.

The lead frame 2 may include a die pad portion 21, a first lead portion 22, a second lead portion 23, and a third lead portion 24. In this preferred embodiment, the first lead portion 22, the second lead portion 23, and the third lead portion 24 may be referred to as a gate lead portion, a collector lead portion, and an emitter lead portion, respectively. Further, each of the first lead portion 22, the second lead portion 23, and the third lead portion 24 has a portion partially exposed from the package 4 and connected to an external circuit of the semiconductor device 1. Thus, the first lead portion 22, the second lead portion 23, and the third lead portion 24 may also be referred to as a first terminal (gate terminal), a second terminal (collector terminal), and a third terminal (emitter terminal). A part of the die pad portion 21 is also exposed from the package 4.

In a plan view, the die pad portion 21 has a quadrangular shape having a pair of first sides 211A, 211B extending in a first direction X and a pair of second sides 212A, 212B extending in a direction crossing the first direction X (in this preferred embodiment, the orthogonal direction, the second direction Y). A hole 25 is formed in the die pad portion 21. The hole 25 is exposed from the package 4, and for example, used as a screw hole at the time of fixing the semiconductor device 1 to a mounting substrate (not shown) or a casing for cooling (not shown).

The first lead portion 22, the second lead portion 23, and the third lead portion 24 are disposed adjacently to the first side 211A on one side of the die pad portion 21.

The first lead portion 22 is formed separately from the die pad portion 21. The first lead portion 22 may include a first pad portion 221 and a first lead 222. In a plan view, the first pad portion 221 is formed in a substantially rectangular shape that is long along the first side 211A of the die pad portion 21. The first lead 222 is formed so as to be integrated with the first pad portion 221 and extends from the first pad portion 221 in a direction crossing the longitudinal direction of the first pad portion 221.

The second lead portion 23 is formed so as to be integrated with the die pad portion 21. The second lead portion 23 extends from the die pad portion 21 in the second direction Y.

The third lead portion 24 is formed separately from the die pad portion 21. The third lead portion 24 may include a third pad portion 241 and a third lead 242. In a plan view, the third pad portion 241 is formed in a substantially rectangular shape that is long along the first side 211A of the die pad portion 21. The third lead 242 is formed so as to be integrated with the third pad portion 241 and extends from the third pad portion 241 in a direction crossing the longitudinal direction of the third pad portion 241.

The conductive member 3 is a member for connecting the lead frame 2 to the semiconductor element 5. In this preferred embodiment, the conductive member 3 is formed of metal wires. The conductive member 3 is not limited to the wires but may be clips, etc. The conductive member 3 is made of a conductive material containing Au, Cu, Al, etc., for example. The conductive member 3 includes a first wire 31 connecting the first lead portion 22 and the semiconductor element 5, and a second wire 32 connecting the third lead portion 24 and the semiconductor element 5. A plurality of the first wires 31 may be connected to the first lead portion 22 and the semiconductor element 5. A plurality of the second wires 32 may be connected to the third lead portion 24 and the semiconductor element 5.

The package 4 covers a part of the lead frame 2, the conductive member 3, and the semiconductor element 5, and may be referred to as sealing resin. The package 4 is made of a material having an insulating property. In this preferred embodiment, the package 4 is made of, for example, black epoxy resin.

The semiconductor element 5 is disposed on the die pad portion 21 of the lead frame 2 and supported by the die pad portion 21. In a plan view, the semiconductor element 5 has a quadrangular shape smaller than the die pad portion 21, having a pair of first sides 51A, 51B and a pair of second sides 52A, 52B. In this preferred embodiment, the semiconductor element 5 is disposed on the die pad portion 21 so that the first sides 51A, 51B are parallel to the first sides 211A, 211B of the die pad portion 21 and the second sides 52A, 52B are parallel to the second sides 212A, 212B of the die pad portion 21.

Figure 2:
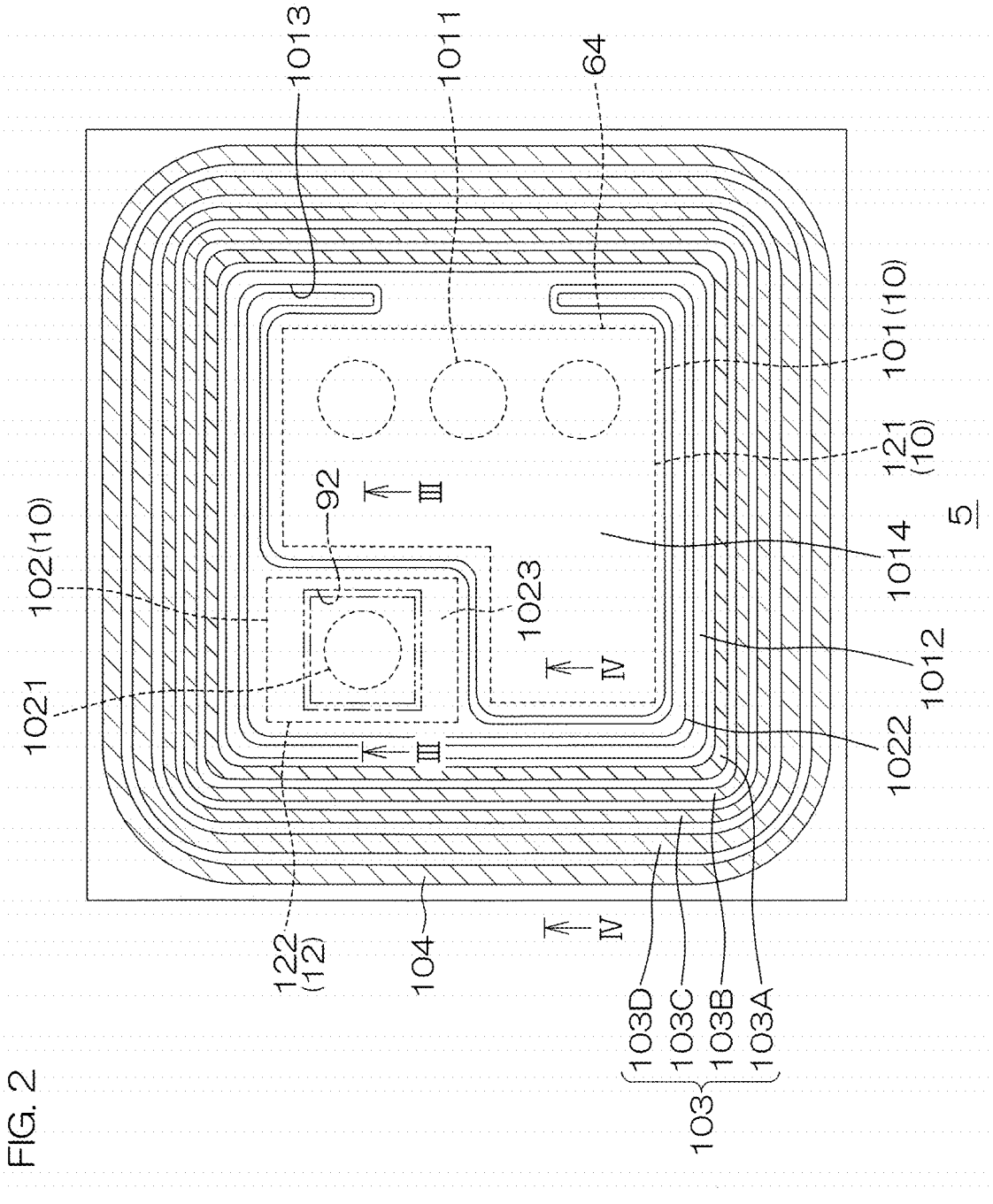
FIG. 2 is a schematic plan view of a semiconductor element in a preferred embodiment of the semiconductor device of FIG. 1.
Figure 3:
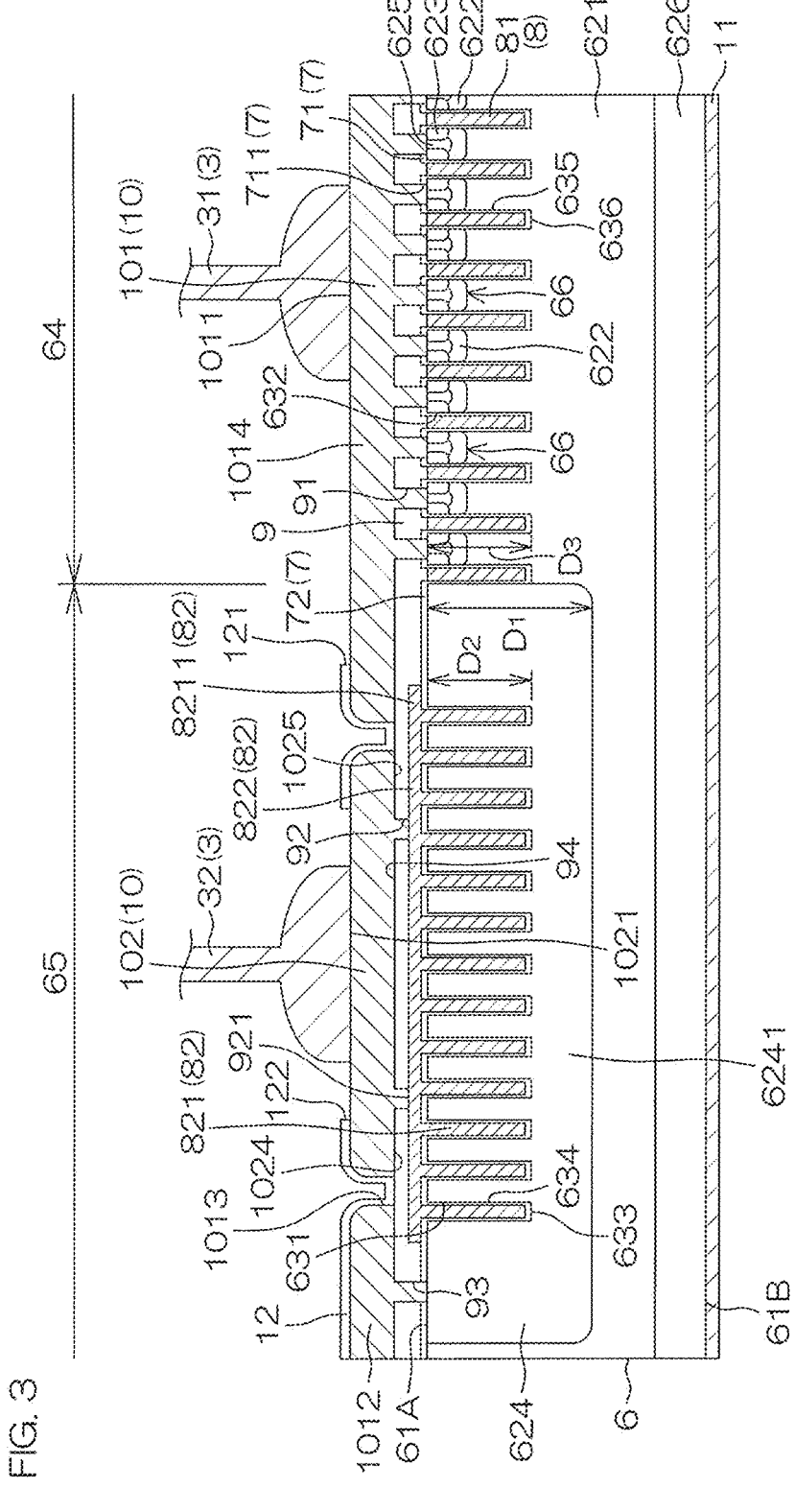
FIG. 3 is a view schematically showing a cross-section taken along line III-III in FIG. 2.
Figure 4:
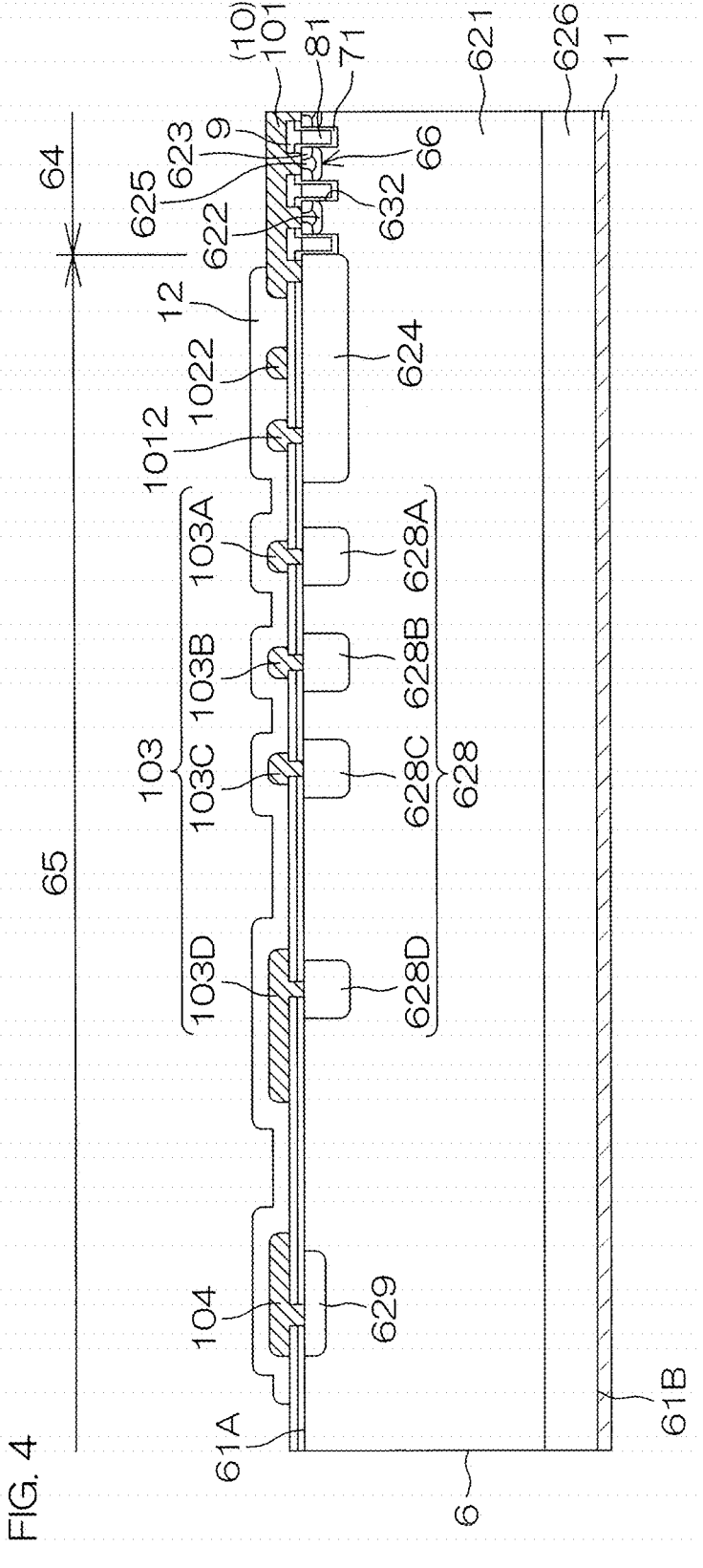
FIG. 4 is a view schematically showing a cross-section taken along line IV-IV in FIG. 2.

FIG. 2 is a schematic plan view of the semiconductor element 5 in a preferred embodiment of the semiconductor device 1 of FIG. 1. FIG. 3 is a view schematically showing a cross-section taken along line III-III of FIG. 2. FIG. 4 is a view schematically showing a cross-section taken along line IV-IV of FIG. 2. FIGS. 3 and 4 do not show the section of FIG. 2 by the same scale.

The semiconductor element 5 includes a semiconductor chip 6, an insulating film 7, a control electrode 8, an auxiliary electrode 82, an interlayer insulating film 9, a front surface electrode film 10, and a collector electrode film 11.

The semiconductor chip 6 is, for example, a structural body in which a monocrystal semiconductor material is formed in a chip shape (rectangular parallelepiped shape). The semiconductor chip 6 is formed by a semiconductor material such as Si and SiC. The semiconductor chip 6 has a first principal surface 61A and a second principal surface 62B on the opposite side of the first principal surface 61A. The first principal surface 61A is a device surface in which a functional device is formed. The second principal surface 61B is a non-device surface in which no functional device is formed. In this preferred embodiment, a cell structure of an IGBT (Insulated Gate Bipolar Transistor) device is formed on the first principal surface 61A. The device structure formed in the semiconductor chip is not limited to this but may be, for example, a MOSFET (Metal Oxide Semiconductor Field Effect Transistor), etc. The semiconductor chip 6 may be referred to as a semiconductor layer.

A first conductive type first region 621 (n-drift), a second conductive type second regions 622 (p-base of the IGBT, p-body of the MOSFET), a first conductive type third regions 623 (n-emitter of the IGBT, n-source of the MOSFET), a second conductive type fourth region 624 (p-well), a second conductive type fifth regions 625 (p+-contact), a second conductive type sixth region 626 (collector), a second conductive type field limit region 628, a first conductive type channel stop region 629, a first recess portion 631, and a second recess portion 632 are formed in the semiconductor chip 6.

The first region 621 is formed over the entire region of a surface layer portion of the first principal surface 61A of the semiconductor chip 6. In this preferred embodiment, the first region 621 may be formed by an epitaxial layer. An n type impurity concentration of the first region 621 may be $1.0 \times 10^{13}$ cm$^{-3}$ or more and $1.0 \times 10^{15}$ cm$^{-3}$ or less. The first region 621 may be referred to as a drift region.

The second regions 622 are p type impurity regions formed in the surface layer portion of the first principal surface 61A in the first region 621. A p type impurity concentration of the second regions 622 may be $1.0 \times 10^{17}$ cm$^{-3}$ or more and $1.0 \times 10^{18}$ cm$^{-3}$ or less. The second regions 622 may be referred to as base regions. The plurality of second regions 622 may be arranged in a planar pattern of a striped shape or a matrix, for example.

The third regions 623 are n type regions selectively formed in the surface layer portion of the first principal surface 61A in the second regions 622. At least one third region 623 is formed in each of the second regions 622. The third region 623 is in contact with the second region 622, and at least a part of the third region 623 is exposed from the first principal surface 61A. An n type impurity concentration of the third regions 623 is higher than the n type impurity concentration of the first region 621, and for example, may be $1.0 \times 10^{18}$ cm$^{-3}$ or more and $1.0 \times 10^{21}$ cm$^{-3}$ or less. The third regions 623 may be referred to as emitter regions.

The fourth region 624 is a p type impurity region selectively formed in the surface layer portion of the first principal surface 61A in the first region 621. The fourth region 624 is formed in a region of the surface layer portion of the first principal surface 61A where the third regions 623 and the fifth regions 625 are not formed. Further, the fourth region 624 may be physically separated from the second regions 622 and surround the second regions 622. The fourth region 624 is formed so as to be deeper than the second regions 622. A depth $D_1$ of the fourth region 624 from the first principal surface 61A may be, for example, 7 μm or more and 10 μm or less. A p type impurity concentration of the fourth region 624 may be $1.0 \times 10^{16}$ cm$^{-3}$ or more and $1.0 \times 10^{19}$ cm$^{-3}$ or less.

The fifth regions 625 are p type impurity regions formed in the surface layer portion of the first principal surface 61A in the second regions 622. The fifth regions 625 reach from the first principal surface 61A to the second regions 622 through the third regions 623. A p type impurity concentration of the fifth regions 625 is higher than the p type impurity concentration of the second regions 622. The p type impurity concentration of the fifth regions 625 may be $1.0 \times 10^{19}$ cm$^{-3}$ or more and $1.0 \times 10^{21}$ cm$^{-3}$ or less. The fifth regions 625 may be referred to as contact regions.

The sixth region 626 is a p type impurity region formed in a surface layer portion of the second principal surface 61B of the semiconductor chip 6. The sixth region 626 is exposed from the second principal surface 61B of the semiconductor chip 6. The sixth region 626 may be formed over the entire region of the semiconductor chip 6. The sixth region 626 may be partially formed in the semiconductor chip 6. For example, a part of the sixth region 626 of FIGS. 3 and 4 may be formed by an n type region, and the collector electrode film 11 may be connected to this n type region. Thereby, the semiconductor element 5 may be a RC-IGBT (Reverse Conducting IGBT). In this preferred embodiment, the sixth region 626 may be formed by a semiconductor substrate. A p type impurity concentration of the sixth region 626 is higher than the p type impurity concentration of the second regions 622. The p type impurity concentration of the sixth region 626 may be $1.0 \times 10^{15}$ cm$^{-3}$ or more and $1.0 \times 10^{18}$ cm$^{-3}$ or less. The sixth region 626 may be referred to as a collector region.

The field limit region 628 is a p type impurity region selectively formed in the surface layer portion of the first principal surface 61A in the first region 621. The field limit region 628 has a p type impurity concentration substantially equal to the p type impurity concentration of the fourth region 624. The field limit region 628 has a depth substantially equal to the depth $D_1$ of the fourth region 624.

The field limit region 628 is formed as a field limit region group including a plurality of (in this embodiment, four) field limit regions 628A, 628B, 628C, 628D. The field limit regions 628A to 628D are formed in this order at intervals along the direction away from the fourth region 624. The field limit regions 628A to 628D may be physically separated from the fourth region 624 and surround the fourth region 624. The field limit regions 628A to 628D extend in a band shape along a peripheral edge of the fourth region 624 in a plan view. More specifically, the field limit regions 628A to 628D are formed in an endless shape (square ring shape) surrounding the fourth region 624 in a plan view. The field limit regions 628A to 628D may be referred to as FLR (Field Limiting Ring) regions.

Further, the field limit regions 628A to 628D may be formed at equal intervals, or the intervals may not be fixed as shown in FIG. 4. In FIG. 4, the interval between the outermost field limit region 628D and the field limit region 628C on the immediately inner side of the field limit region 628D is wider than the intervals between the other field limit regions 628A to 628C.

The channel stop region 629 is an n type impurity region selectively formed in the surface layer portion of the first principal surface 61A in the first region 621. An n type impurity concentration of the channel stop region 629 is higher than the n type impurity concentration of the first region 621 and may be, for example, $1.0 \times 10^{18}$ cm$^{-3}$ or more and $1.0 \times 10^{21}$ cm$^{-3}$ or less.

The channel stop region 629 may be physically separated from the field limit region 628 and surround the field limit region 628. The channel stop region 629 extends in a band shape along a peripheral edge of the field limit region 628 in a plan view. More specifically, the channel stop region 629 is formed in an endless shape (square ring shape) surrounding the fourth region 624 in a plan view.

A region surround by the fourth region 624 may be referred to as an active region 64, and a region outside the active region 64 may be referred to as an inactive region 65. The inactive region 65 may be referred to as an outer peripheral region. The active region 64 is a region where a cell structure 66 in which a current path is formed by voltage control of the control electrode 8 is formed. The cell structure 66 (trench cell structure) including the second recess portion 632, the control electrode 8, the second regions 622, the third regions 623, and the fifth regions 625 is formed in the active region 64.

The first recess portion 631 is a groove portion formed in the surface layer portion of the first principal surface 61A. The first recess portion 631 is formed in a region of the semiconductor chip 6 where the fourth region 624 is formed. A depth $D_2$ of the first recess portion 631 from the first principal surface 61A is shallower than the depth $D_1$ of the fourth region 624. That is, a portion 6241 of the fourth region 624 is interposed between a bottom portion 633 of the first recess portion 631 and the first region 621 in the thickness direction of the semiconductor chip 6. Since the depth $D_2$ of the first recess portion 631 from the first principal surface 61A is shallower than the depth $D_1$ of the fourth region 624, the bottom portion 633 of the first recess portion 631 is covered by the fourth region 624. Thus, it is possible to suppress an electric field from concentrating on the bottom portion 633 of the first recess portion 631. The depth $D_2$ of the first recess portion 631 from the first principal surface 61A may be, for example, 6 μm or less. The portion 6241 of the fourth region 624 between the bottom portion 633 of the first recess portion 631 and the first region 621 preferably has a thickness of 1 μm or more. A plurality of the first recess portions 631 may be formed. The first recess portions 631 are formed in a striped shape extending in the second direction Y.

The second recess portion 632 is a groove portion formed in the surface layer portion of the first principal surface 61A. The second recess portion 632 is formed by regular planar patterns and partitions the cell structure 66 in the semiconductor chip 6. A plurality of the second recess portions 632 may be formed. For example, the plurality of second recess portions 632 may be formed in a striped shape extending in the second direction Y. Thereby, the cell structure 66 (second regions 622) may be formed between the adjacent second recess portions 632. Further, the active region 64 may be defined as a region on the inner side of the second recess portion 632 which is on the outermost side among the striped-shaped second recess portions 632. In the case where the second recess portions 632 are formed in a grid pattern, a region on the inner side of the ring-shaped second recess portion 632 forming an outer periphery of the grid may be defined as the active region 64. Further, the second recess portion 632 may be referred to as a gate trench.

The second recess portion 632 passes through the second regions 622, the third regions 623, and the fifth regions 625, and reaches to the first region 621. The second recess portion 632 has a depth $D_3$ from the first principal surface 61A, substantially equal to the first recess portion 631.

The insulating film 7 is formed on the first principal surface 61A. The insulating film 7 may be referred to as a gate insulating film. The insulating film 7 may include a first insulating film 71 and a second insulating film 72.

The first insulating film 71 is formed in the active region 64. The first insulating film 71 is formed so as to cover the second recess portion 632. The first insulating film 71 covers a part of the first principal surface 61A, an inner wall 635 of the second recess portion 632, and a bottom portion 636 of the second recess portion 632. Openings 711 from which the first principal surface 61 is exposed are formed in the first insulating film 71. The first insulating film 71 is in contact with the second regions 622 and the third regions 623. The first insulating film 71 is made of a material having an insulating property, the material containing $SiO_2$, SiN, etc., for example. The first insulating film 71 has a thickness of 100 nm or more and 120 nm or less.

The second insulating film 72 is formed so as to cover the first recess portion 631. The second insulating film 72 covers a part of the first principal surface 61A, an inner wall 634 of the first recess portion 631, and the bottom portion 633 of the first recess portion 631. The second insulating film 72 is in contact with the fourth region 624. The second insulating film 72 is made of a material having an insulating property, the material containing $SiO_2$, SiN, etc., for example. The second insulating film 72 has a thickness of 100 nm or more and 120 nm or less. The first insulating film 71 and the second insulating film 72 are formed so as to be integrated.

The control electrode 8 is accommodated in the second recess portion 632. The control electrode 8 is in contact with the first insulating film 71. The control electrode 8 opposes the second regions 622 via the first insulating film 71. By voltage being applied, the control electrode 8 forms a current path (channel) in the second region 622 on the inner wall 635 of the second recess portion 632. By making such a structure, it is possible to realize miniaturization and reduce ON voltage in comparison to a planar structure. The control electrode 8 is made of a conductive material containing polysilicon, etc. The control electrode 8 may be referred to as a gate electrode or a first gate electrode.

The auxiliary electrode 82 is in contact with the second insulating film 72. The auxiliary electrode 82 includes a first portion 821 embedded in the first recess portion 631, and a second portion 822 formed so as to be integrated with the first portion 821 and formed on the first principal surface 61A. The first portion 821 projects to the inner side of the semiconductor chip 6 from the second portion 822. The auxiliary electrode 82 is made of a conductive material containing polysilicon, etc. As described later, the auxiliary electrode 82 assists an increase in parasitic capacitance between a first electrode film 101 and a second electrode film 102, and is therefore defined as an auxiliary electrode. However, the auxiliary electrode 82 may be referred to as a second gate electrode or an embedded electrode.

The interlayer insulating film 9 is formed on the first principal surface 61A. The interlayer insulating film 9 covers the insulating film 7, the control electrode 8, and the auxiliary electrode 82. The interlayer insulating film 9 is made of a material having an insulating property, the material containing $SiO_2$, SiN, etc.

First through holes 91 and second through holes 92 are formed on the interlayer insulating film 9. The first through holes 91 are formed on the active region 64. The first through holes 91 are formed so as to overlap the openings 711 formed in the first insulating film 71 in a plan view. The second through holes 92 are formed on the auxiliary electrode 82. The second through holes 92 are formed in a ring shape in a plan view.

The front surface electrode film 10 includes the first electrode film 101, the second electrode film 102, a field electrode film 103, and an EQR electrode film 104.

The first electrode film 101 is formed on the interlayer insulating film 9 and connected to the third regions 623 and the fifth regions 625 via the first through holes 91 provided in the interlayer insulating film 9. The first electrode film 101 is an electrode for inputting a reference potential that serves as reference for operation of a transistor. The first electrode film 101 is formed at least on the active region 64. A part of the first electrode film 101 may be formed at a position opposing an end portion 8211 of the first portion 821 in a plan view. The first electrode film 101 may be referred to as an emitter electrode. The first electrode film 101 is made of a conductive material containing a material of Al, Cu, etc. The first electrode film 101 may include a plating layer of Ni, Au, etc., formed on these conductive materials. The first electrode film 101 may be referred to as a first electrode layer.

The first electrode film 101 includes a first pad portion 1014 and a first lead-out portion 1012.

The first pad portion 1014 is formed in an island shape and connected to one end of the first wire 31 in a first wire connection portion 1011. The first pad portion 1014 may be referred to as an emitter pad portion.

The first lead-out portion 1012 is led out from the first pad portion 1014. The first lead-out portion 1012 extends in a band shape along an outer periphery of the first pad portion 1014 and is formed in an endless shape (square ring shape) surrounding the first pad portion 1014. The first lead-out portion 1012 is connected to the fourth region 624 via a third through hole 93 provided in the interlayer insulating film 9. A connection position of the first lead-out portion 1012 and the fourth region 624 (position of the third through hole 93) may be on the outside of the first recess portion 631. The first lead-out portion 1012 may be referred to as an emitter routing portion.

The second electrode film 102 is formed on the interlayer insulating film 9 and connected to the second portion 822 of the auxiliary electrode 82 via the second through holes 92 provided in the interlayer insulating film 9. The second electrode film 102 is an electrode for inputting a control signal of the semiconductor element 5. In a plan view, the second electrode film 102 covers the auxiliary electrode 82. In other words, the second electrode film 102 may oppose the second portion 822 of the auxiliary electrode 82 over the entire region from one end portion 1024 to the other end portion 1025 in the direction along the first principal surface 61A in a cross-sectional view shown in FIG. 3.

The second electrode film 102 is electrically connected to the control electrode 8 and the auxiliary electrode 82. With this arrangement, it is possible to increase the insulating film 7 connected to the second electrode film 102. Thus, it is possible to increase the parasitic capacitance between the first electrode film 101 and the second electrode film 102. As a result, it is possible to provide a semiconductor device 1 having good electrostatic breakdown resistance characteristics. The second electrode film 102 is made of a conductive material containing a material of Al, Cu, etc. The second electrode film 102 may include a plating layer of Ni, Au, etc., formed on these conductive materials. The second electrode film 102 may be referred to as a second electrode layer.

The second electrode film 102 includes a second pad portion 1023 and a second lead-out portion 1022.

The second pad portion 1023 is formed in an island shape and connected to one end of the second wire 32 in a second wire connection portion 1021. In a plan view, the second wire connection portion 1021 is formed at a position not overlapping the second through holes 92. That is, the second electrode film 102 (second pad portion 1023) is connected to the one end of the second wire 32 in a region where the second through holes 92 are avoided in a plan view. For example, a level difference is generated between a front surface 94 of the interlayer insulating film 9 and bottom surfaces 921 of the second through holes 92 (front surface of the auxiliary electrode 82). Due to this level difference, the portions embedded in the second through holes 92 of the second electrode film 102 may be recessed in comparison to the other regions of the second electrode film 102. Thus, by connecting the second wire 32 to the second electrode film 102 in the region where the second through holes 92 are avoided, it is possible to prevent connection failure of the second wire 32.

The second lead-out portion 1022 is led out from the second pad portion 1023. The second lead-out portion 1022 extends in a band shape along the outer periphery of the first electrode film 101, surrounds the first electrode film 101, and has a pair of opening ends which are open at one side of the first principal surface 61A. The second lead-out portion 1022 may be formed in a clearance 1013 between the first electrode film 101 and the first lead-out portion 1012. The second lead-out portion 1022 is made of a conductive material containing a material of Al, Cu, etc. The second lead-out portion 1022 may include a plating layer of Ni, Au, etc., formed on these conductive materials. The second lead-out portion 1022 may be referred to as a gate finger.

The field electrode film 103 is formed so as to surround the first electrode film 101 and the second electrode film 102 in a plan view. The field electrode film 103 is formed as a field electrode film group including a plurality of (in this embodiment, four) field electrode films 103A, 103B, 103C, 103D. The field electrode films 103A to 103D are formed in this order at intervals along the direction away from a center of the semiconductor chip 6 in a plan view. The field electrode films 103A to 103D are in an electrically floating state. In this preferred embodiment, the field electrode films 103A to 103D are formed in an endless shape (square ring shape) surrounding the first electrode film 101 and the second electrode film 102. At least one field electrode film 103 may be formed in an ended shape. The field electrode film 103 is made of a conductive material containing a material of Al, Cu, etc. The field electrode film 103 may include a plating layer of Ni, Au, etc., formed on these conductive materials. The field electrode films 103A to 103D are respectively connected to the field limit regions 628A to 628D through the interlayer insulating film 9 and the insulating film 7.

The EQR (EQui-potential Ring) electrode film 104 is routed in a band shape along the field electrode film 103 at an interval from the field electrode film 103D in the direction away from the center of the semiconductor chip 6. In this preferred embodiment, the EQR electrode film 104 is formed in an endless shape (square ring shape) surrounding the field electrode film 103. The EQR electrode film 104 is an electrode to hold an outer periphery of the semiconductor chip 6 at a fixed potential. The EQR electrode film 104 is connected to the channel stop region 629 through the interlayer insulating film 9 and the insulating film 7.

The collector electrode film 11 is formed on the second principal surface 61B. The collector electrode film 11 may be formed over the entire region of the second principal surface 61B. The collector electrode film 11 is in contact with the sixth region 626. The collector electrode film 11 is made of a conductive material containing a material of Al, Ni, Ag, Au, etc., for example. In the collector electrode film 11, Ni and Au may be a plating layer formed by plating.

The semiconductor element 5 may include a protective film 12. The protective film 12 covers at least a part of each of the first electrode film 101, the second electrode film 102, the field electrode film 103, and the EQR electrode film 104. A first opening 121 from which a part of the first electrode film 101 is exposed and a second opening 122 from which a part of the second electrode film 102 is exposed are formed in the protective film 12. At least the first wire connection portions 1011 are exposed from the first opening 121. At least the second wire connection portion 1021 is exposed from the second opening 122. The protective film 12 is made of a material containing polyimide, etc.

Next, with reference to FIGS. 5 to 10, a manufacturing method of the semiconductor element 5 will be described. FIGS. 5 to 10 are longitudinal cross-sectional views showing a part of the manufacturing process of the semiconductor device 1 in the order of steps.

Figure 5:
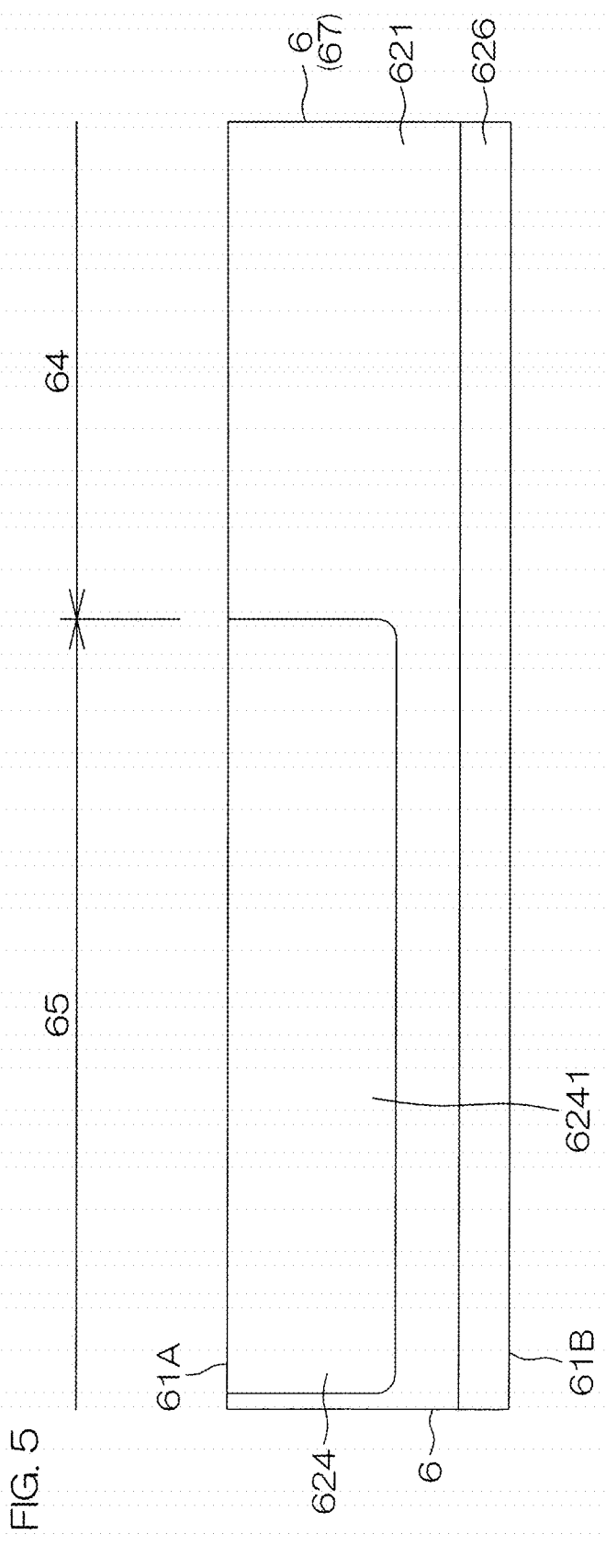
FIG. 5 is a view showing a part of the manufacturing process in a preferred embodiment of a semiconductor element of FIG. 1.

Upon manufacturing the semiconductor element 5, as shown in FIG. 5, first, a semiconductor wafer 67 to be divided into the semiconductor chips 6 is prepared. Next, the p type sixth region 626 and the n type first region 621 are formed in order from the second principal surface 62B to the first principal surface 61A in the semiconductor wafer 67. On the side of the first principal surface 61A of the first region 621, the p type fourth region 624, the p type field limit region 628, and the n type channel stop region 629 are selectively formed. A seventh region may be a semiconductor substrate.

Figure 6:
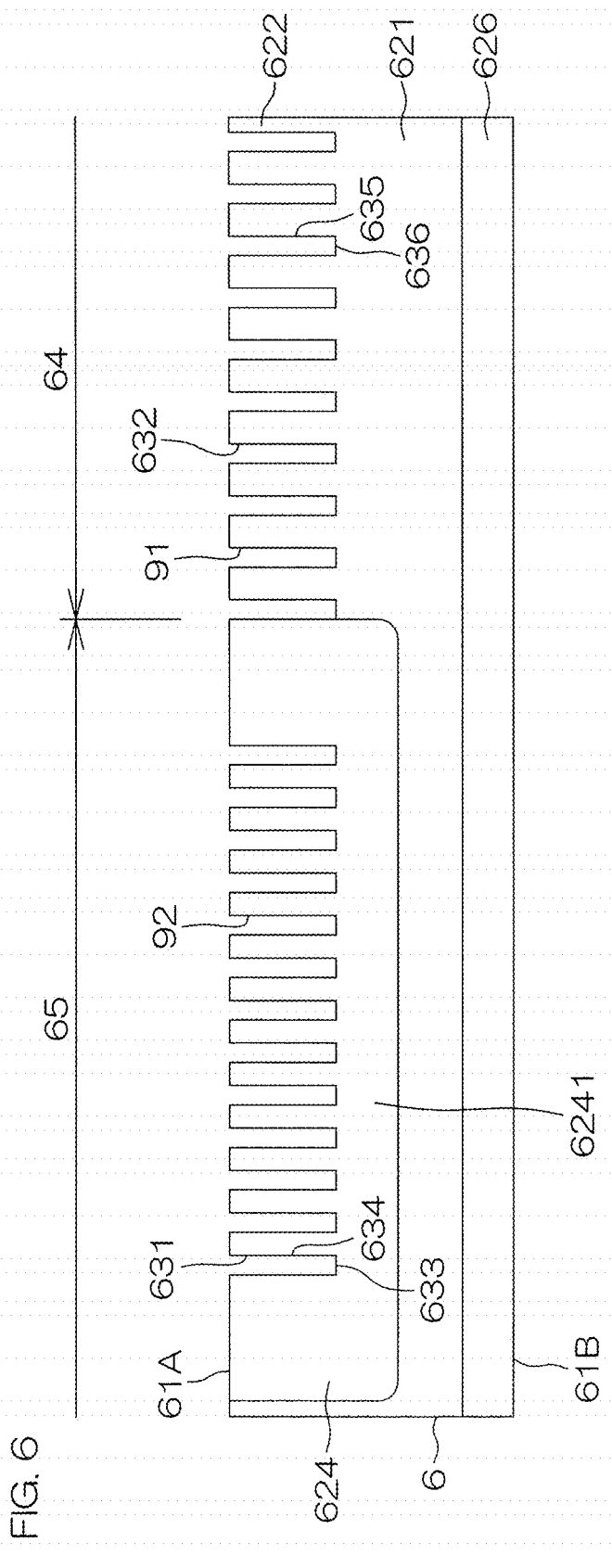
FIG. 6 is a view showing a step subsequent to that of FIG. 5.

Next, as shown in FIG. 6, for example, by etching via a photoresist (not shown), the first recess portion 631 is formed in the region of the first principal surface 61A where the fourth region 624 is exposed, and the second recess portion 632 is formed in the region of the first principal surface 61A where the first region 621 is exposed. The first recess portion 631 and the second recess portion 632 are formed at the same time in the same step. Thus, the first recess portion 631 and the second recess portion 632 have substantially the same depth from the first principal surface 61A.

Figure 7:
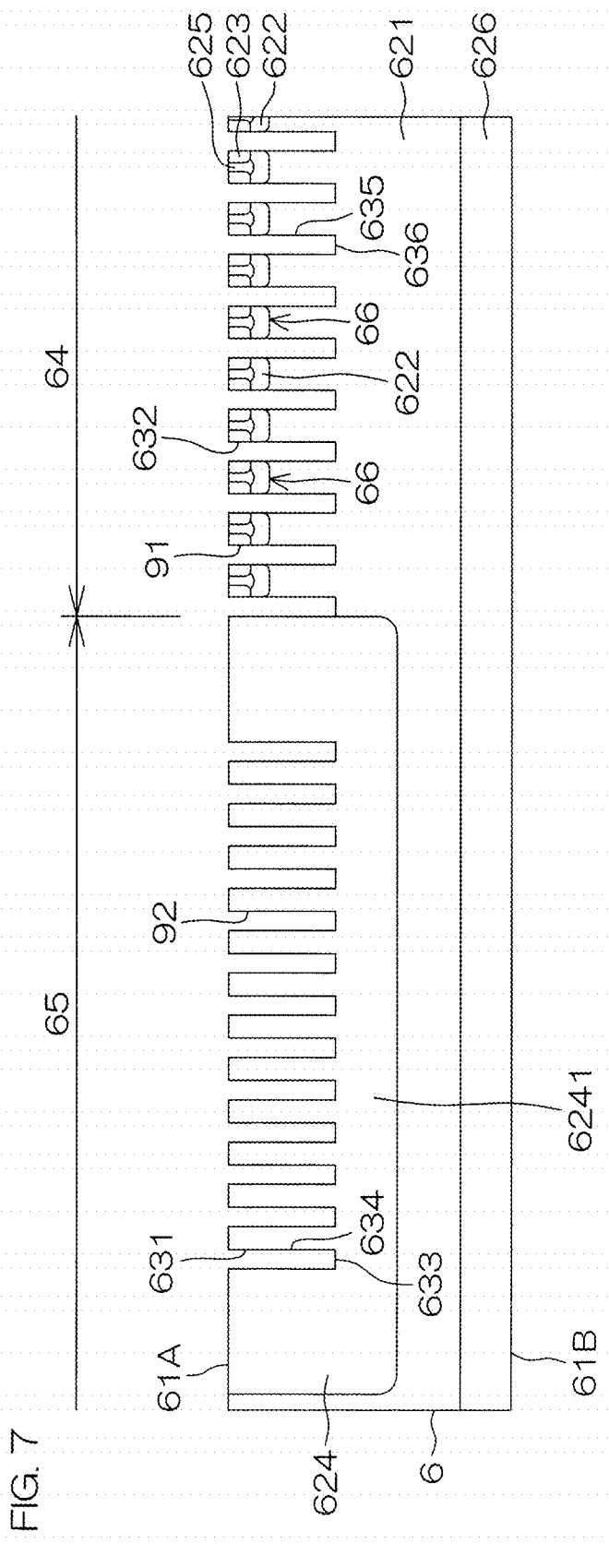
FIG. 7 is a view showing a step subsequent to that of FIG. 6.

Next, as shown in FIG. 7, the second regions 622, the third regions 623, and the fifth regions 625 are formed in the region where the second recess portion 632 is formed. The fifth regions 625 are formed on the side of the first principal surface 61A with respect to the bottom portion 633 of the second recess portion 632. The second regions 622 are formed on the side of the first principal surface 61A with respect to the fifth regions 625. The third regions 623 are formed on the side of the first principal surface 61A with respect to the second regions 622 and exposed from the first principal surface 61A.

Figure 8:
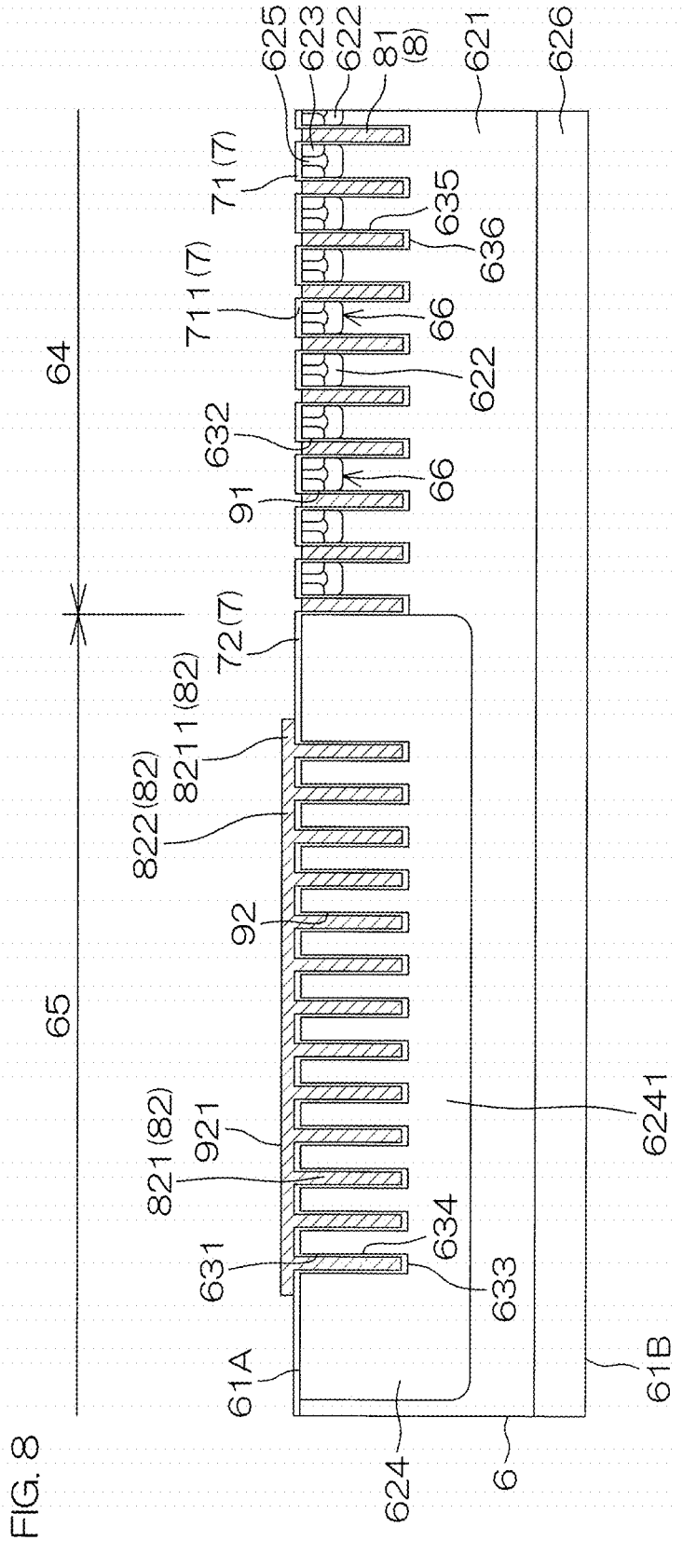
FIG. 8 is a view showing a step subsequent to that of FIG. 7.

Next, as shown in FIG. 8, for example, by thermal oxidation, the insulating film 7 is formed on the first principal surface 61A so as to cover the first recess portion 631 and the second recess portion 632. The insulating film 7 includes the second insulating film 72 covering the first recess portion 631 and the first insulating film 71 covering the second recess portion 632. Next, for example, by the CVD method, the control electrode 8 is formed on the first insulating film 71 and the auxiliary electrode 82 is formed on the second insulating film 72.

Figure 9:
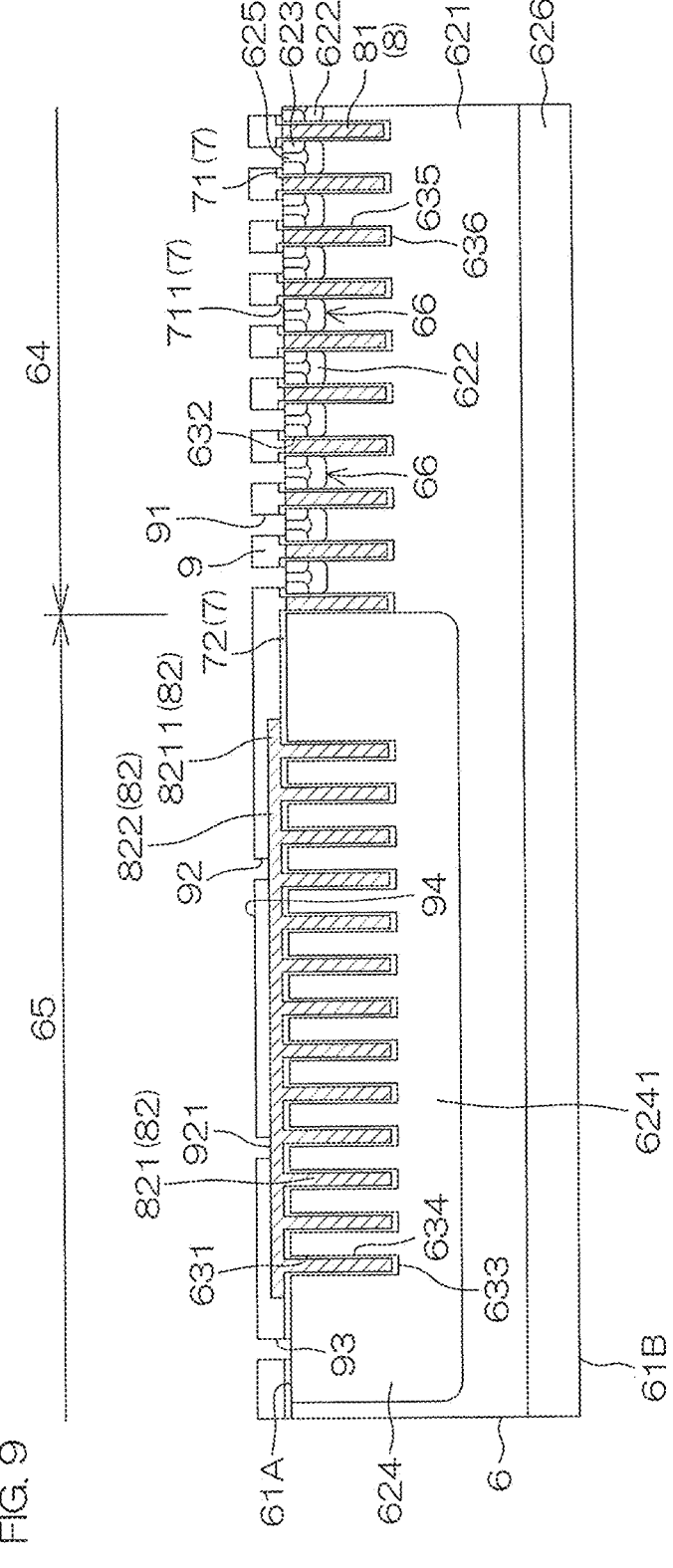
FIG. 9 is a view showing a step subsequent to that of FIG. 8.

Next, as shown in FIG. 9, for example, by the CVD method, the interlayer insulating film 9 is formed on the first principal surface 61A so as to cover the control electrode 8 and the auxiliary electrode 82. Next, for example, by etching via a photoresist (not shown), the first through holes 91 from which the third regions 623 and the fifth regions 625 are exposed, the second through holes 92 from which a part of the auxiliary electrode 82 is selectively exposed, and the third through hole 93 from which the fourth region 624 is exposed are formed.

Figure 10:
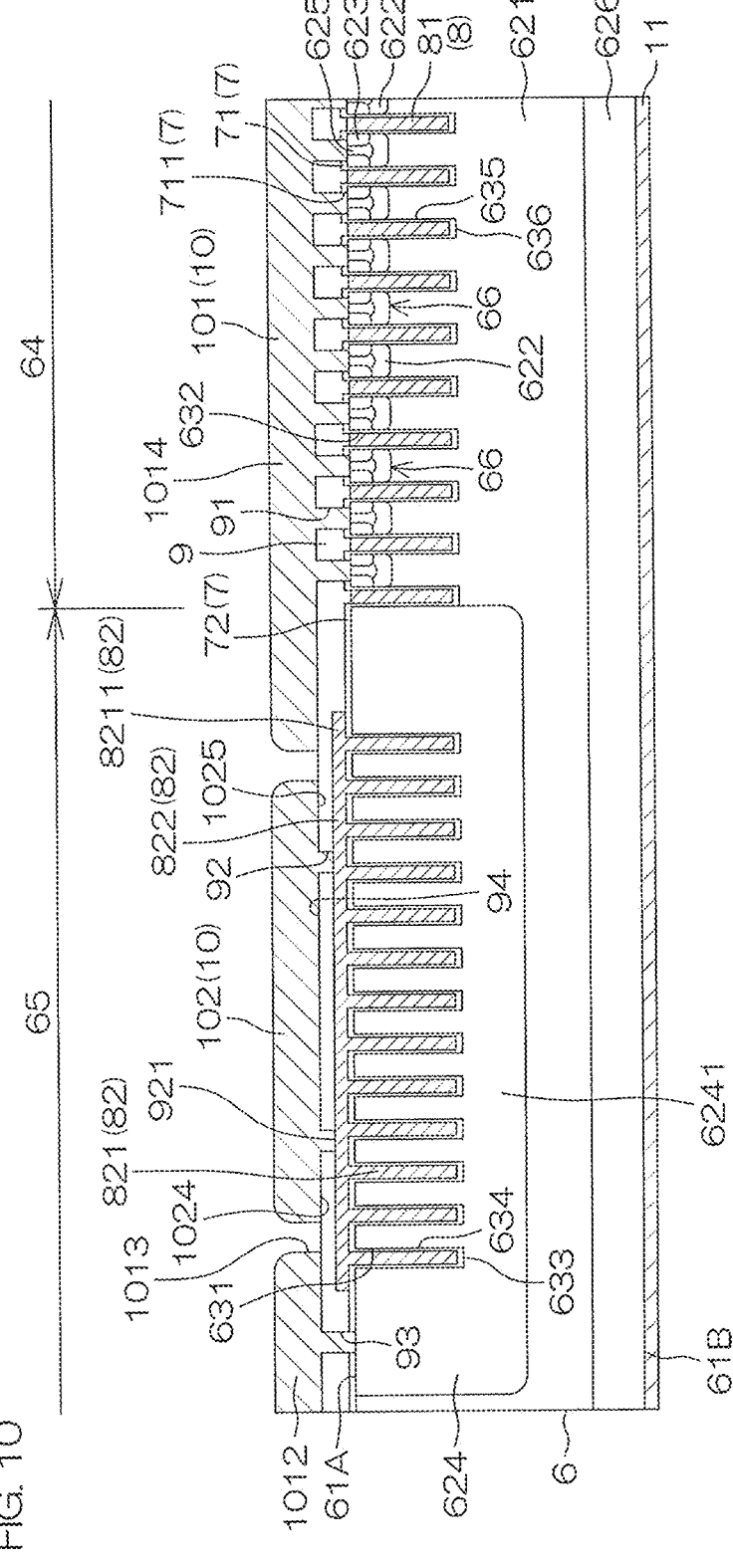
FIG. 10 is a view showing a step subsequent to that of FIG. 9.

Next, as shown in FIG. 10, for example, by the sputtering method, the front surface electrode film 10 is formed on the interlayer insulating film 9. Next, by patterning, the front surface electrode film 10 is divided into the first electrode film 101, the second electrode film 102, the field electrode film 103, and the EQR electrode film 104. The first electrode film 101 is connected to the third regions 623 and the fifth regions 625 via the first through holes 91 and connected to the fourth region 624 via the third through hole 93. The second electrode film 102 is connected to the auxiliary electrode 82 via the second through holes 92. Next, for example, by the sputtering method, the collector electrode film 11 is formed on the second principal surface 61B.

After that, the semiconductor element 5 is manufactured by dividing the semiconductor wafer 67 into each of the semiconductor chips 6.

Figure 11:
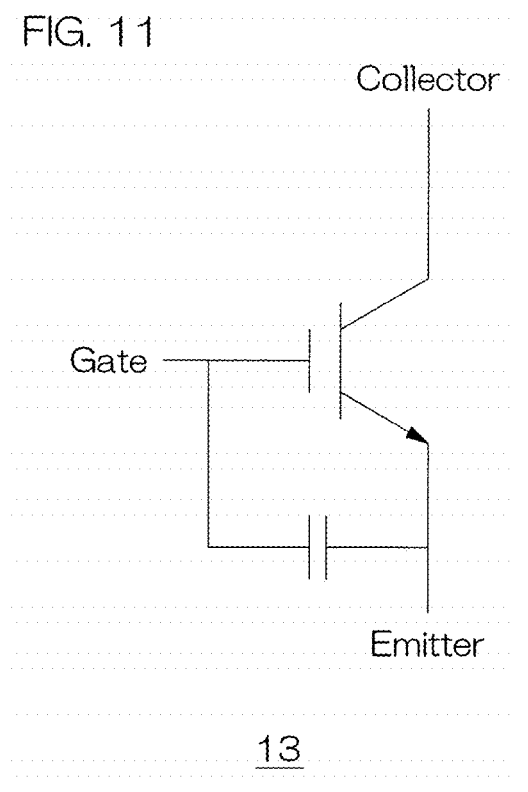

FIG. 11 is a circuit diagram showing an electrical structure of the semiconductor device 1.

An electric arrangement of the semiconductor element 5 can be schematically expressed by a circuit diagram in which a capacitor 13 is connected between a gate and an emitter of a conventional IGBT device as shown in FIG. 11. That is, with the arrangement of the semiconductor element 5, parasitic capacitance $C_{ge}$ between the gate and the emitter is increased in comparison to the conventional IGBT device.

Since the IGBT device has a structure in which a gate electrode is insulated by an insulating film, parasitic capacitance is provided between each terminal of the gate, the collector, and the emitter. The electrostatic breakdown resistance characteristics of the IGBT device has a correlation with input capacitance $C_{ies}=C_{ge}C_{gc}$ expressed by the sum of parasitic capacitance $C_{ge}$ between the gate and the emitter and parasitic capacitance $C_{gc}$ between the gate and the collector. Therefore, by increasing the parasitic capacitance $C_{ge}$ between the gate and the emitter, it is possible to provide a semiconductor device having good electrostatic breakdown resistance characteristics.

Thus, in this semiconductor element 5, the auxiliary electrode 82 is electrically connected to the control electrode 8 via the second electrode film 102. Since the auxiliary electrode 82 is embedded in the first recess portion 631, for example, in comparison to the case where only the second portion 822 formed in a layer shape along the first principal surface 61A is formed, it is possible to increase the parasitic capacitance $C_{ge}$ between the auxiliary electrode 82 and the fourth region 624 which oppose each other via the second insulating film 72. Thereby, it is possible to increase the parasitic capacitance $C_{ge}$ between the gate and the emitter as a whole. As a result, it is possible to provide a semiconductor device 1 having good electrostatic breakdown resistance characteristics.

Further, with the arrangement of the semiconductor element 5, output capacitance $C_{oes}=C_{ce}+C_{gc}$ expressed by the sum of parasitic capacitance $C_{ge}$ between the collector and the emitter and the parasitic capacitance $C_{gc}$ between the gate and the collector is not increased. Thus, at the time of turning the gate off, an electric current due to $C_{oes}$ does not flow output and does not adversely affect the characteristics such as a turn-off time which is the time required until the output is completely turned off.

In addition, the auxiliary electrode 82 is formed in the inactive region 65 outside the active region 64. Therefore, even when the auxiliary electrode 82 is formed, it is possible to suppress the influence of a layout change, etc., on the cell structure 66. Thus, it is possible to maintain the characteristics of ON resistance, etc., of the semiconductor device 1.

Second Preferred Embodiment

Figure 12:
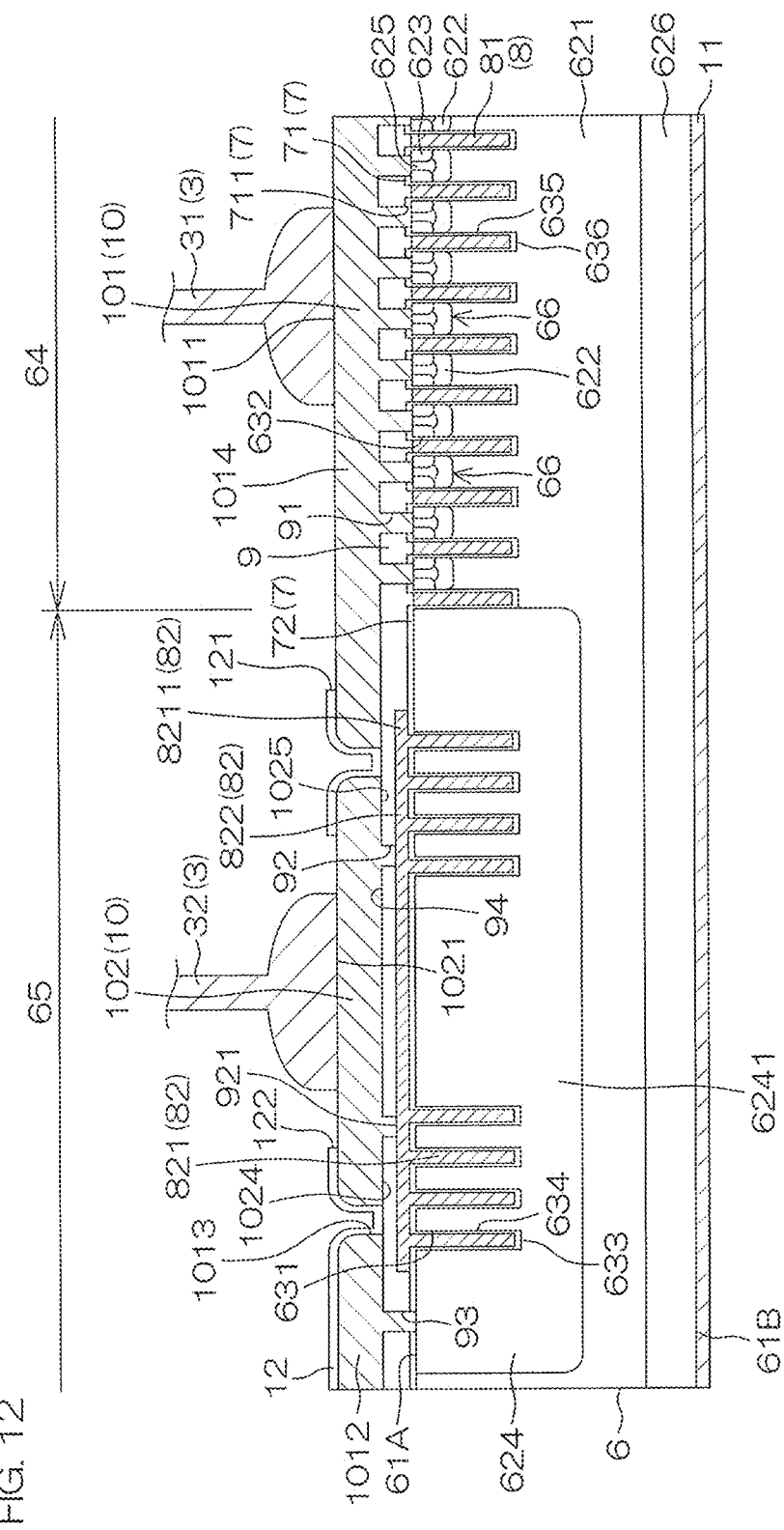
FIG. 12 is a schematic cross-sectional view of a semiconductor element according to a second preferred embodiment of the present disclosure.

With reference to FIG. 12, a cross-sectional structure of a semiconductor element 5 according to a second preferred embodiment of the present disclosure will be described.

In this preferred embodiment, a first recess portion 631 is formed in a region where the lower side of a second wire 32 connected to a second electrode film 102 is avoided. A plurality of the first recess portions 631 may be formed. With this arrangement, it is possible to suppress projections and recesses on a front surface of a second wire connection portion 1021 of the second electrode film 102. Thus, it is possible to favorably bond the second wire 32 to the second electrode film 102. Since the other arrangements are the same as the first preferred embodiment, description thereof will be omitted.

Third Preferred Embodiment

Figure 13:
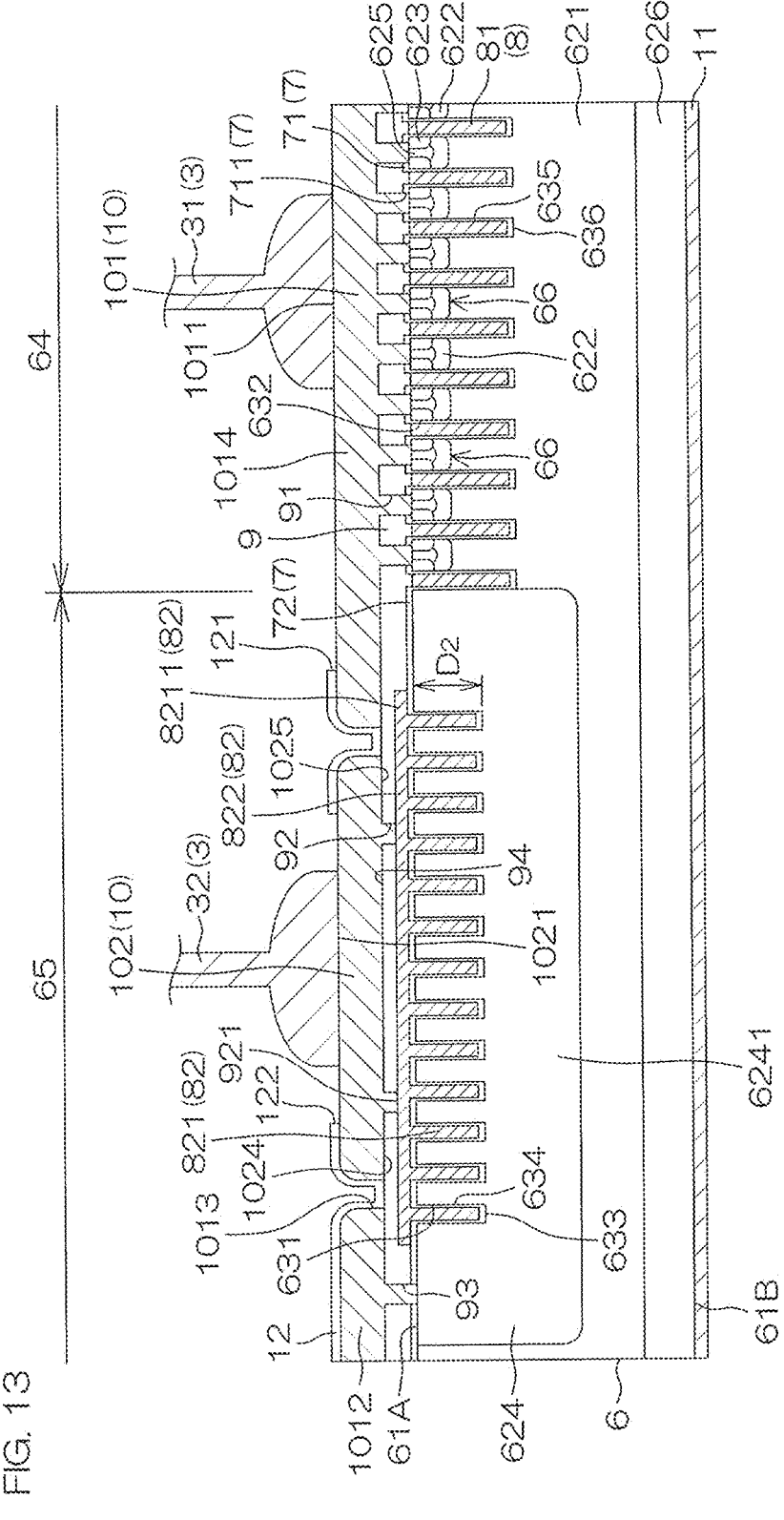
FIG. 13 is a schematic cross-sectional view of a semiconductor element according to a third preferred embodiment of the present disclosure.

With reference to FIG. 13, a cross-sectional structure of a semiconductor element 5 according to a third preferred embodiment of the present disclosure will be described.

In this preferred embodiment, a first recess portion 631 is formed so that a depth $D_2$ from a first principal surface 61A is shallower than a depth $D_3$ of a second recess portion 632 from the first principal surface 61A. In this case, the first recess portion 631 and the second recess portion 632 may be formed in separate steps. With this arrangement, it is possible to suppress an electric field from concentrating on a bottom portion of the first recess portion 631. A plurality of the first recess portions 631 may be formed. Since the other arrangements are the same as the first preferred embodiment, description thereof will be omitted.

Although the preferred embodiments of the present disclosure are described above, the present disclosure can be implemented in other embodiments.

For example, an arrangement that the conductive types of each semiconductor portion of the semiconductor element 5 are reversed may be adopted. For example, in the semiconductor element 5, the p type portions may be n type portions, and the n type portions may be p type portions.

Additionally, designs can be variously changed within the range of items listed in the Claims.

REFERENCE SIGNS LIST

1: semiconductor device
2: lead frame
21: die pad portion
22: first lead portion
221: first pad portion
222: first lead
23: second lead portion
24: third lead portion
241: third pad portion
242: third lead
25: hole
3: conductive member
31: first wire
32: second wire
4: package
5: semiconductor element
6: semiconductor chip
61A: first principal surface
61B: second principal surface
621: first region
622: second region
623: third region
624: fourth region
625: fifth region
626: sixth region
628: field limit region 629: channel stop region
631: first recess portion
632: second recess portion
633: bottom portion
634: inner wall
635: inner wall
636: bottom wall
64: active region
65: inactive region
66: cell structure
67: semiconductor wafer
7: insulating film
71: first insulating film
711: opening
72: second insulating film
8: control electrode
82: auxiliary electrode
821: first portion
8211: end portion
822: second portion
9: interlayer insulating film
91: first through hole
92: second through hole
921: bottom surface
93: third through hole
94: front surface
10: front surface electrode film
101: first electrode film
1011: first wire connection portion
1012: first lead-out portion
1013: clearance
1014: first pad portion
102: second electrode film
1021: second wire connection portion
1022: second lead-out portion
1023: second pad portion
1024: one end portion
1025: other end portion
103: field electrode film
104: EQR electrode film
11: collector electrode film
12: protective film
121: first opening portion
122: second opening portion
13: capacitor
$D_1$: depth
$D_2$: depth
$D_3$: depth

The invention claimed is:

1. A semiconductor device comprising:
a semiconductor layer having a first principal surface and a second principal surface on an opposite side of the first principal surface;
a first region of a first conductivity type formed in a surface layer portion of the first principal surface of the semiconductor layer;
a cell structure having a second region of a second conductivity type formed in a surface layer portion of the first region, a third region of the first conductivity type formed in the surface layer portion of the first region such that the third region is in contact with the second region, and a control electrode opposing the second region via a first insulating film adjacent to the second region, the control electrode forming a current path in the second region;

a first electrode layer formed on the first principal surface of the semiconductor layer such that the first electrode layer covers the cell structure, and electrically connected to the third region;

a second electrode layer formed on the first principal surface of the semiconductor layer separately from the first electrode layer, and electrically connected to the control electrode;

a first recess portion formed in the surface layer portion of the first principal surface of the semiconductor layer such that the first recess portion faces the second electrode layer;

a second insulating film covering the first recess portion; and an auxiliary electrode embedded in the first recess portion via the second insulating film, and electrically connected to the second electrode layer, wherein the auxiliary electrode includes a first portion embedded in the first recess portion, and a second portion formed such that the second portion is integrated with the first portion and formed on the first principal surface of the semiconductor layer, when viewed in a direction perpendicular to a thickness direction of the semiconductor layer, the second electrode layer has one end and another end, and the second portion of the auxiliary electrode has one end and another end, and the one end and the other end of the second electrode layer are disposed between the one end and the other end of the second portion of the auxiliary electrode.

2. The semiconductor device according to claim 1, comprising:

a fourth region of the second conductivity type formed in the surface layer portion of the first region such that the fourth region faces the second electrode layer, wherein the first recess portion is formed in the fourth region.

3. The semiconductor device according to claim 2, wherein a part of the fourth region is interposed between a bottom portion of the first recess portion and the first region in the thickness direction of the semiconductor layer.

4. The semiconductor device according to claim 2, wherein a first depth of the fourth region from the first principal surface is 7 μm or more and 10 μm or less, and a second depth of the first recess portion from the first principal surface is 6 μm or less.

5. The semiconductor device according to claim 1, wherein the cell structure includes a trench cell structure having a second recess portion formed in the surface layer portion of the first principal surface of the semiconductor layer, the control electrode embedded in the second recess portion via the first insulating film, the third region and the second region formed on a side surface of the second recess portion in order from the first principal surface to the second principal surface.

6. The semiconductor device according to claim 5, wherein the first recess portion and the second recess portion have substantially the same depth.

7. The semiconductor device according to claim 5, wherein a depth of the first recess portion is smaller than a depth of the second recess portion.

8. The semiconductor device according to claim 5, wherein both the first recess portion and the second recess portion are formed in a striped shape extending in a first direction.

9. The semiconductor device according to claim 1, comprising:

a collector region of the second conductivity type formed in a surface layer portion of the second principal surface of the semiconductor layer, wherein the cell structure includes an IGBT cell structure having a base region formed of the second region, an emitter region formed of the third region, and a gate electrode formed of the control electrode.

10. The semiconductor device according to claim 1, further comprising an interlayer insulating film with a through hole, which is disposed between the second electrode layer and the auxiliary electrode.

11. A semiconductor device comprising:

a semiconductor layer having a first principal surface and a second principal surface on an opposite side of the first principal surface;

an active region formed in a surface layer portion of the first principal surface of the semiconductor layer, the active region in which a cell structure is formed, the cell structure having a control electrode formed on a first insulating film in contact with the semiconductor layer, in which a current path is formed by voltage control of the control electrode;

a first electrode layer formed on the active region, and connected to the current path;

a second electrode layer formed on the first principal surface of the semiconductor layer in a region outside the active region, and electrically connected to the control electrode;

a first recess portion formed in the surface layer portion of the first principal surface of the semiconductor layer such that the first recess portion faces the second electrode layer;

a second insulating film covering the first recess portion; and an auxiliary electrode embedded in the first recess portion via the second insulating film, and electrically connected to the second electrode layer, wherein the auxiliary electrode includes a first portion embedded in the first recess portion, and a second portion formed such that the second portion is integrated with the first portion and formed on the first principal surface of the semiconductor layer, when viewed in a direction perpendicular to a thickness direction of the semiconductor layer, the second electrode layer has one end and another end, and the second portion of the auxiliary electrode has one end and another end, and the one end and the other end of the second electrode layer are disposed between the one end and the other end of the second portion of the auxiliary electrode.

12. The semiconductor device according to claim 1, wherein the second insulating film has a thickness of 100 nm or more and 120 nm or less.

13. The semiconductor device according to claim 1, wherein the semiconductor device comprises:

a third insulating film formed between the second portion of the auxiliary electrode and the second electrode layer, the third insulating film having a contact hole for connection between the auxiliary electrode and the second electrode layer; and a conductive member connected to the second electrode layer in a region where the contact hole is avoided in a plan view.

14. The semiconductor device according to claim 13, wherein the second electrode layer includes a pad electrode layer to which the conductive member is connected.

15. The semiconductor device according to claim 10, further comprising a conductive wire connected to the second electrode layer in a region where the hole is avoided in a plan view.

* * * * *